United States Patent [19]

Yamamoto

[11] Patent Number: 4,542,438
[45] Date of Patent: Sep. 17, 1985

[54] HYBRID INTEGRATED CIRCUIT DEVICE

[75] Inventor: Toshio Yamamoto, Yokosuka, Japan

[73] Assignee: Toshiba Corporation, Kawasaki, Japan

[21] Appl. No.: 413,400

[22] Filed: Aug. 31, 1982

[30] Foreign Application Priority Data

Sep. 7, 1981 [JP] Japan .................. 56-139656

[51] Int. Cl.[4] .............................. H05K 3/32
[52] U.S. Cl. ..................... 361/403; 29/843;
228/175; 228/180.2
[58] Field of Search ........ 174/68.5; 361/403;
228/175, 179, 180 A, 180 R; 29/843

[56] References Cited

U.S. PATENT DOCUMENTS

| | | | |
|---|---|---|---|
| 2,784,297 | 3/1957 | Pityo | 29/878 X |
| 3,233,034 | 2/1966 | Grabbe | 174/68.5 |
| 3,238,421 | 3/1966 | Patrick | 174/68.5 X |
| 3,708,878 | 1/1973 | Mann et al. | 29/879 X |
| 3,740,202 | 6/1973 | Swengel et al. | 219/118 X |
| 4,242,719 | 12/1980 | Conley | 174/68.5 X |
| 4,296,456 | 10/1981 | Reid | 361/403 |
| 4,349,862 | 9/1982 | Bajorek et al. | 174/68.5 X |

Primary Examiner—R. R. Kucia
Attorney, Agent, or Firm—Cushman Darby & Cushman

[57] ABSTRACT

Circuit elements and lead connecting metal pieces are set on a conductor circuit formed on a ceramic substrate and are bonded to the conductor circuit by reflow soldering. A head of a lead is set on each of the metal pieces and connected thereto by setting electrodes in contact with the lead head and supplying welding current from the electrodes through the lead head and metal piece.

5 Claims, 8 Drawing Figures

F I G. 1
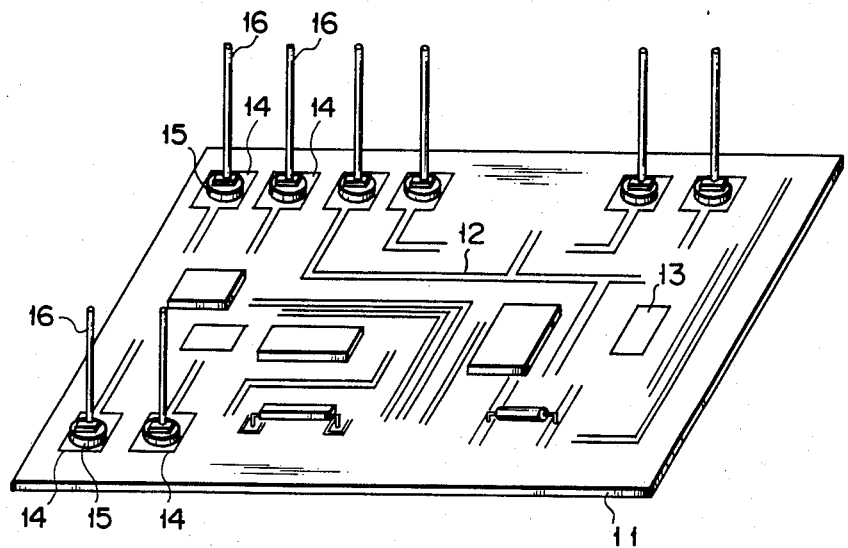
F I G. 2
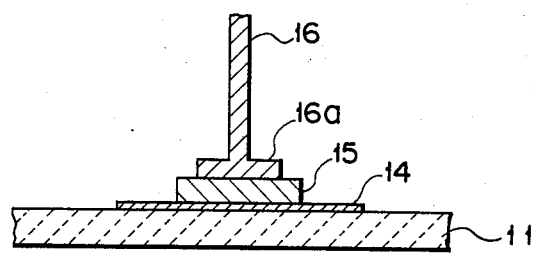

4,542,438

HYBRID INTEGRATED CIRCUIT DEVICE

BACKGROUND OF THE INVENTION

This invention relates to an integrated circuit device, and more particularly to a hybrid integrated circuit device.

In the manufacture of the prior art hybrid integrated circuit devices, leads are connected to a lead connecting conductor layer formed on a ceramic substrate by inserting the T-shaped heads of the lead through small holes penetrating the conductor layer and substrate until the T-shaped heads reach the back side of the substrate. At this stage, various circuit elements such as IC elements, resistors, capacitors and the like have already been provided on the substrate. After the leads, as well as the circuit elements, have been set in the ceramic substrate, the substrate is put into a furnace to solder the circuit elements and leads to the substrate by reflow soldering. Thereafter, resistor layers, for instance, which are formed on the substrate, are trimmed to adjust their resistance to a predetermined value and wire-bonding is carried out for the IC elements. The trimming operation and the wire-bonding operation for the IC elements are very inconvenient since the leads project from the substrate. Also, the automation of the trimming and wire-bonding operations is very difficult because of the projecting leads. Further, in order to connect the leads to the substrate, they have to be inserted through the holes formed in the substrate from the back side thereof. Therefore, the operation of mounting leads has very poor control properties, and its automation is also very difficult.

To overcome the above drawbacks, it has been proposed to mount circuit elements other than leads on the substrate by reflow soldering, subsequently trim the resistors and the like and wire-bond the IC elements and then bond the individual leads to the substrate by means of soldering using infrared rays, a laser beam or a soldering iron. In this method, however, the substrate has to be washed once after the first reflow soldering process and before the trimming and once again after the leads have been bonded. Further, since two soldering processes are involved, the soldering portions are heated twice. Therefore, a phenomenon occurs wherein the solder is diffused into the lead connecting conductor layer formed on the substrate. This phenomenon deteriorates the mechanical strength of the soldered portions.

It has further been proposed to weld leads to the lead connecting conductor layer on the substrate by percussion welding. According to this method, however, splash is produced between the lead and lead connecting conductor layer to reduce the reliability of the hybrid integrated circuit device.

SUMMARY OF THE INVENTION

Accordingly, an object of the present invention is to provide a hybrid integrated circuit device and a method of manufacturing the same, in which it is possible to improve the operation control property during manufacture and readily permit automation of the operation.

According to the invention, there is provided a hybrid integrated circuit device and a method of manufacturing the same, in which circuit elements and lead connection conductor pieces are bonded by reflow soldering to conductors formed by paste printing on an insulating substrate, for instance a ceramic substrate, and heads of leads are subsequently placed on the conductor pieces and bonded thereto by welding and reflow soldering.

BRIEF DESCRIPTION OF THE DRAWINGS

FIG. 1 is a schematic perspective view showing an embodiment of the hybrid integrated circuit device according to the invention;

FIG. 2 is a sectional view, to an enlarged scale, showing a lead wire in the hybrid integrated circuit device shown in FIG. 1;

DETAILED DESCRIPTION OF THE PREFERRED EMBODIMENT

Figure 3:
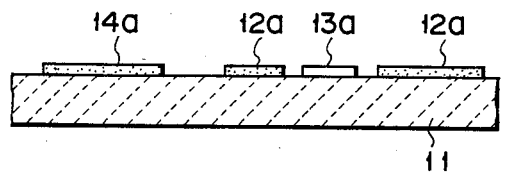
FIGS. 3 through 5 are fragmentary sectional views showing a structure in the process of manufacture of the hybrid integrated circuit device shown in FIG. 1.

FIG. 1 shows a hybrid integrated circuit device. In the device, a circuit including conductors 12, resistors 13 and bonding pads 14 are formed on an insulating substrate 11, for instance a ceramic substrate having two surfaces opposed to each other. The bonding pads on the substrate 11 are connected to the semiconductor elements such as IC elements and transistors and also such circuit elements as capacitors and inductors. Each bonding pad is soldered to a conductor piece e.g. metal piece 15, as shown in FIG. 2, which is made of steel or an iron alloy. A T-shaped head 16a of a lead wire element (hereinafter lead 16) is welded to the metal piece 15 so that the lead 16 extends in a direction perpendicular to the surface of the substrate 11, i.e., upright from the substrate 11.

Figure 4:
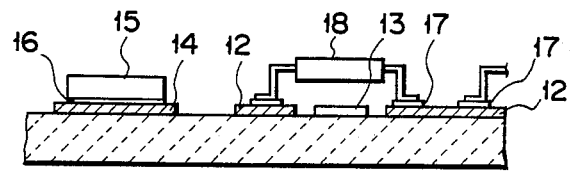
Figure 5:
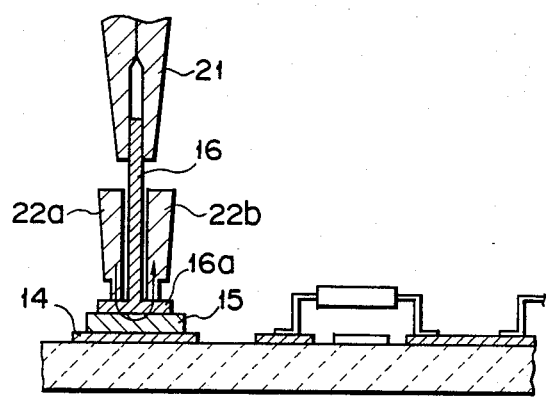

Now, the method of manufacturing the hybrid integrated circuit device of FIG. 1 will be described with reference to FIGS. 3 through 5.

As shown in FIG. 3, paste layers 12a, 13a and 14a, respectively corresponding to conductors 12, a resistor 13 and a bonding pad 14 are printedly coated on, for instance, a ceramic substrate 11. The substrate with the paste coatings is then dried and baked. By this baking process, the paste layers 12a, 13a and 14a are firmly bonded to the substrate 11 so that they will serve as the conductor 12, resistor 13 and bonding pad 14 respectively. Solder pastes 16 and 17 are then coated on the bonding pad 14 and the circuit element connecting portions of the conductors 12, respectively, as shown in FIG. 4. After the solder pastes 16 and 17 have been dried, a metal piece 15 plated with nickel or tin is placed on the solder paste 16, and also a circuit element 18 is put on the solder pastes 17. After all the metal pieces 15 and circuit elements 18 have been set on the substrate 11 at predetermined positions, the substrate 11 is then led into a heating furnace. As the substrate 11 passes through the heating furnace, the solder pastes 16, 17, . . . are fused so that the metal pieces 15 and circuit elements 18 are soldered to the bonding pads 14 and conductors 12, respectively. After the soldering has been completed, the substrate 11 is washed.

Figure 6:
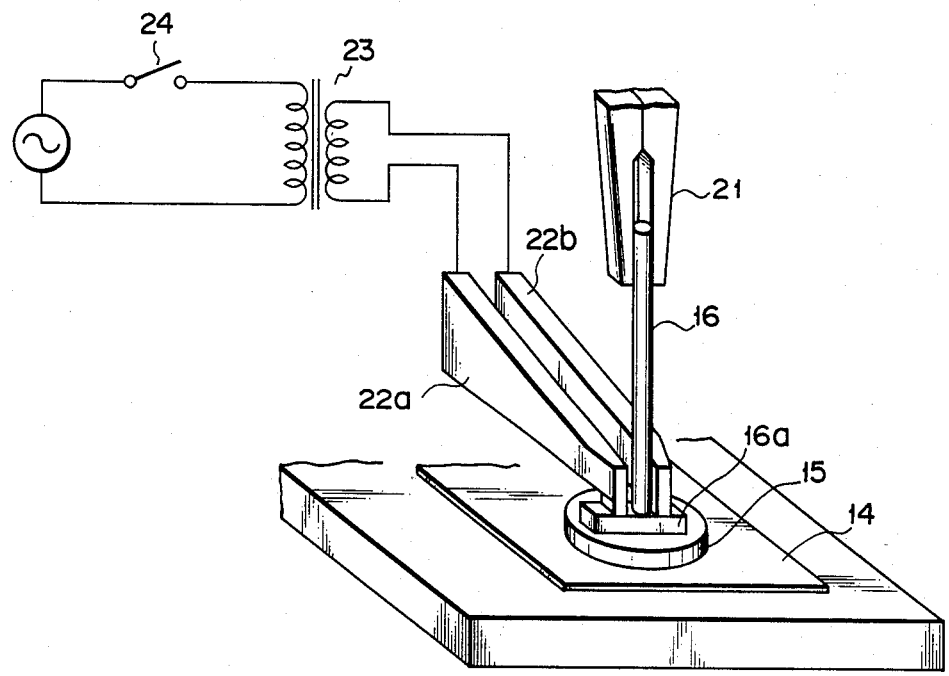
FIG. 6 is a perspective view of a portion of the device shown in FIG. 5.

After the washing, the wire-bonding for IC elements as well as the trimming of the resistors 13 and checking of characteristics are performed. Such operations can be easily carried out since the leads 16 are not yet provided upright on the substrate 11. After such operations, the leads 16 are connected to the metal pieces 15. FIG. 5 shows the step of connecting the leads. As is shown, each lead 16 is picked up at its end other than its solder-plated T-shaped head by a pick-up member 21, and the head 16a is set on the metal piece 15. Then, welding electrodes 22a and 22b are placed on the lead head 16a such that they sandwich the lead 16. FIG. 6 shows this set-up in detail. The electrodes 22a and 22b are respectively connected to the opposite ends of the primary winding of a transformer 23. When a switch 24 is closed, welding current is supplied to the electrodes 22a and 22b. The switch 24 is a pressure switch, which is closed when the electrodes 22a and 22b urge the lead head 16a with a predetermined pressure. When the welding current is supplied to the electrodes 22a and 22b, it flows from the electrode 22a through the lead head 16a into the metal piece 15 and then flows out of the metal piece 15 through the lead head 16a to the electrode 22b, as shown by an arrow in FIG. 5. As the welding current flows across the boundary between the lead head 16 and metal piece 15, the lead head 16a and metal piece 15 are welded together by this current and the urging forces exerted by the electrodes 22a and 22b. At this time, the solder plated on the lead head 16a is fused and accumulated around the junction between the lead head 16a and metal piece 15. When the accumulated solder is solidified, it acts to reinforce the connection between the lead head and the metal piece. The welding takes place at the boundary between the lead head 16a and the metal piece 15 across the current path, so that the lead head 16a is soldered in its central portion and peripheral portion.

After one lead 16 has been connected to a metal piece 15, the pick-up member 21 is then driven to pick up another lead 16 and place it on another metal piece 15. Then, the soldering of the lead head 16a and metal piece 15 is carried out in the manner as described above. In this way, the leads 15 are automatically and successively soldered to the respective metal pieces 15. When all the leads 16 have been soldered to the metal pieces 15, the hybrid integrated circuit device of FIG. 1 is obtained.

The mechanical strength that can be obtained by connecting the lead 16 to the conductor 14 on the substrate 11 by means of the metal piece 15 and the mechanical strength obtainable by the conventional percussion welding, will now be discussed with reference to FIGS. 7 and 8.

Figure 7:
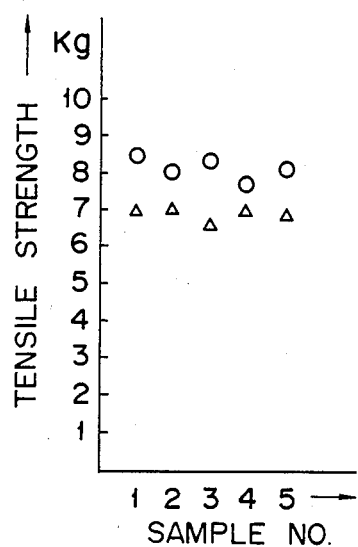
FIG. 7 is a graph showing the tensile strength of a lead.

In FIG. 7, the ordinate represents the tensile strength, and the abscissa is taken for the sample number. The circular marks indicate tensile strengths obtained according to the present invention, and the triangular marks indicate tensile strengths in case of the percussion welding. The leads used were copper wires 0.5 mm in diameter and plated with tin. As is seen from the Figure, according to the present invention, the tensile strength is in the neighborhood of 8 kg, whereas according to the percussion welding it is in the neighborhood of 7 kg. That is, according to the invention the tensile strength can be increased substantially by 1 kg.

Figure 8:
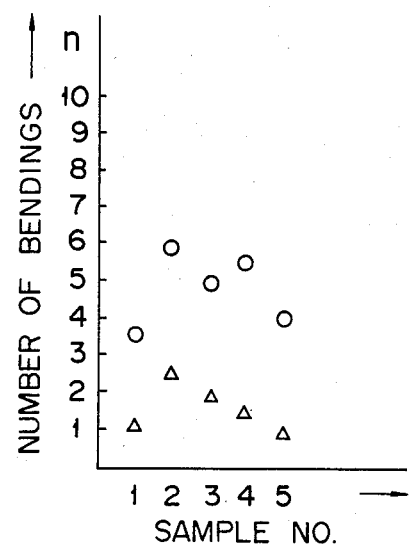
FIG. 8 is a graph showing the bending strength of a lead.

In FIG. 8, the ordinate represents the bending strength, i.e., the number of possible repetitions of 45° bending. As can be seen from the Figure, according to the prior art percussion welding process, the lead is broken at the connecting section after only a couple of bending operations, whereas in the present invention, the lead is not broken until it has been bent five or six times. As has been shown, according to the invention, the tensile strength and bending strength can be improved.

As has been described in the foregoing, according to the invention, there is provided a hybrid integrated circuit device and a method of manufacturing the same, in which circuit elements and lead connection metal pieces are bonded by reflow soldering to conductors formed by paste printing on a ceramic substrate and lead heads are subsequently placed on the metal pieces and welded and soldered thereto by a current passed through the lead head into the metal piece and thence through the lead head again. Thus, according to the invention, the trimming and wire-bonding operations after the reflow soldering can easily be done since at this stage no leads project upright from the substrate. In addition, unlike the prior art, the leads can be connected to the substrate without using the cumbersome operation of passing leads through holes. Thus, the operation of connecting leads can be readily automated.

While in the above embodiment the lead head has been T-shaped, it may also be L-shaped as well. Further, while in the above embodiment the lead has been entirely plated with solder, it is also possible to plate at least one of the lead and metal piece with solder.

What is claimed is:

1. A hybrid integrated circuit device comprising:
   a circuit substrate including an insulating substrate having two surfaces opposed to each other and a conductor circuit pattern having at least one connecting poad formed on one of the surfaces of said substrate;
   circuit elements soldered to said conductor circuit pattern of said circuit substrate;
   at least one metal piece plated with solder and soldered to said at least one connecting pad of said conductor circuit pattern of said circuit substrate, said metal piece having a free surface opposed to the surface oldered to said connecting pad; and
   at least one lead wire having a T-shaped head and being plated with said solder, said at least one lead wire being soldered to said metal piece and welded at said T-shaped head to the free surface of said metal piece which is opposed to the surface soldered to said connecting pad so as to project from said circuit substrate.

2. The hybrid integrated circuit device according to claim 1, wherein said at least one lead wire element is disposed on the side of said insulating substrate, on which said circuit elements are provided.

3. The hybrid integrated circuit device according to claim 1 or 2, wherein said insulating substrate is a ceramic substrate.

4. The hybrid integrated circuit device according to claim 1, wherein said lead wire element extends in a direction perpendicular to the surface of said inslulating substrate.

5. The hybrid integrated circuit device according to claim 1, wherein said metal piece is plated with tin and said lead wire element is a copper wire plated with solder.

* * * * *

UNITED STATES PATENT AND TRADEMARK OFFICE
CERTIFICATE OF CORRECTION

PATENT NO. : 4,542,438

DATED : September 17, 1985

INVENTOR(S) : YAMAMOTO, T.

It is certified that error appears in the above-identified patent and that said Letters Patent is hereby corrected as shown below:

The assignee should be shown as: TOKYO SHIBAURA DENKI KABUSHKI KAISHA.

Signed and Sealed this

Fourth Day of March 1986

[SEAL]

Attest:

DONALD J. QUIGG

Attesting Officer

Commissioner of Patents and Trademarks